United States Patent [19]

Cahill et al.

[11] 4,084,259
[45] Apr. 11, 1978

[54] APPARATUS FOR DOT MATRIX RECORDING

[75] Inventors: Lysle D. Cahill, Dayton; Arthur R. Brunswick, Xenia, both of Ohio

[73] Assignee: The Mead Corporation, Dayton, Ohio

[21] Appl. No.: 514,203

[22] Filed: Oct. 11, 1974

Related U.S. Application Data

[63] Continuation-in-part of Ser. No. 420,639, Nov. 30, 1973, abandoned.

[51] Int. Cl.² .......................... H04N 1/28; H04N 1/04
[52] U.S. Cl. .................................... 364/900; 358/296; 358/298; 346/78
[58] Field of Search ............ 178/6.6 R, 6.6 A, 6.7 R, 178/5, 6; 346/75, 78, 79, 94, 105; 340/172.5; 101/DIG. 2, DIG. 15; 364/900; 358/296, 298

[56] References Cited

U.S. PATENT DOCUMENTS

| 3,604,846 | 9/1971 | Behane et al. | 178/6.6 R |
| 3,681,650 | 8/1972 | Koll | 178/6.7 R |
| 3,689,693 | 9/1972 | Cahill et al. | 178/6.6 R |
| 3,723,646 | 3/1973 | Behane et al. | 178/6.6 R |
| 3,757,036 | 9/1973 | Libbet et al. | 178/6.6 R |
| 3,806,641 | 4/1974 | Crooks | 340/172.5 |

OTHER PUBLICATIONS

Data Corporation Technical Note-DTN-71-4, "Data Digital Graphics Generator, Models BP-7004 & BP-7005, Jul. 1971, pp. 1-13, 29-35.
Klensch et al., "Electronically Generated Halftone Pictures", *RCA Review*, Sep. 1970, pp. 517-533.

*Primary Examiner*—Leo H. Boudreau
*Attorney, Agent, or Firm*—Biebel, French & Nauman

[57] ABSTRACT

A dot matrix recording system records a wide range of gray levels without compromising recording resolution. Resolution is maintained by using a relatively small dot matrix, preferably a 2 by 2 matrix, for representation of the graphic information at a point within an image being reproduced. When adjacent points within the image have the same optical density, then the matrix representation thereof is altered from point to point so as to produce a matrix of effectively increased size. The larger matrix or matrix group may comprise 4 of the 2 by 2 matrices positioned in a square arrangement. Thus when two horizontally adjacent points within an image have the same optical density and are situated immediately above two other points having the same optical density, then the four-point area is represented by a matrix group comprising a total of 16 matrix cells arranged in a 4 by 4 pattern. Such an arrangement permits recording a gray scale comprising 17 gray levels from white to black, while preserving the resolution afforded by the smaller 2 by 2 matrix. A further gray scale extension is obtained by a "special case" technique wherein the 2 by 2 matrices are combined into a rectangular matrix group which is 2 matrices high by 4 or 6 matrices wide for a total of 32 or 48 matrix cells.

6 Claims, 14 Drawing Figures

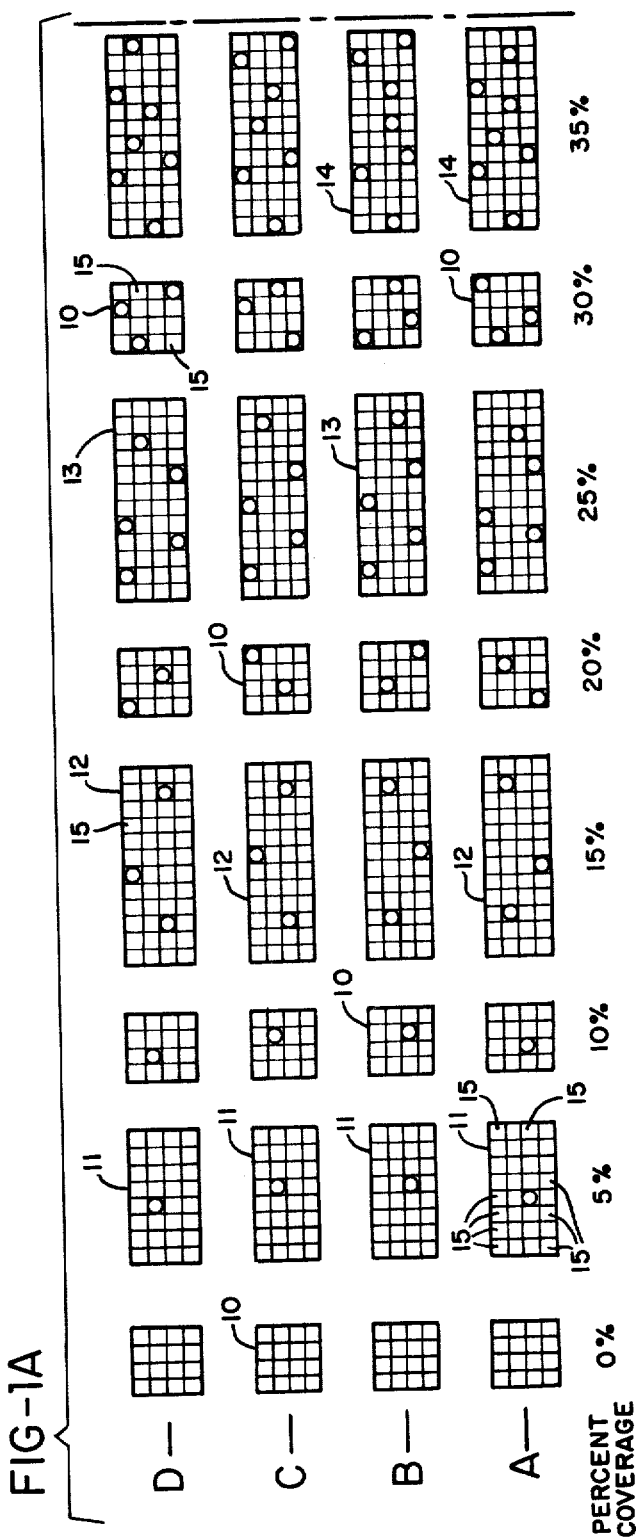
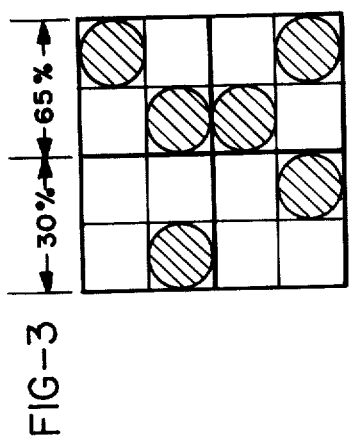
FIG-2
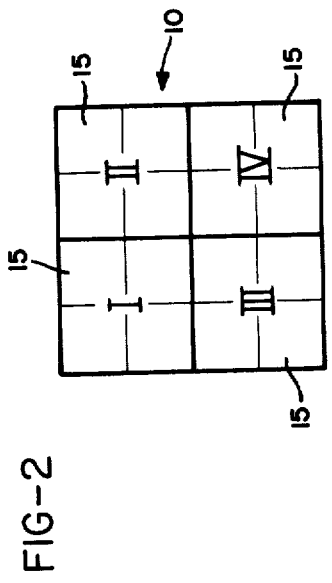
FIG-3
FIG-1A

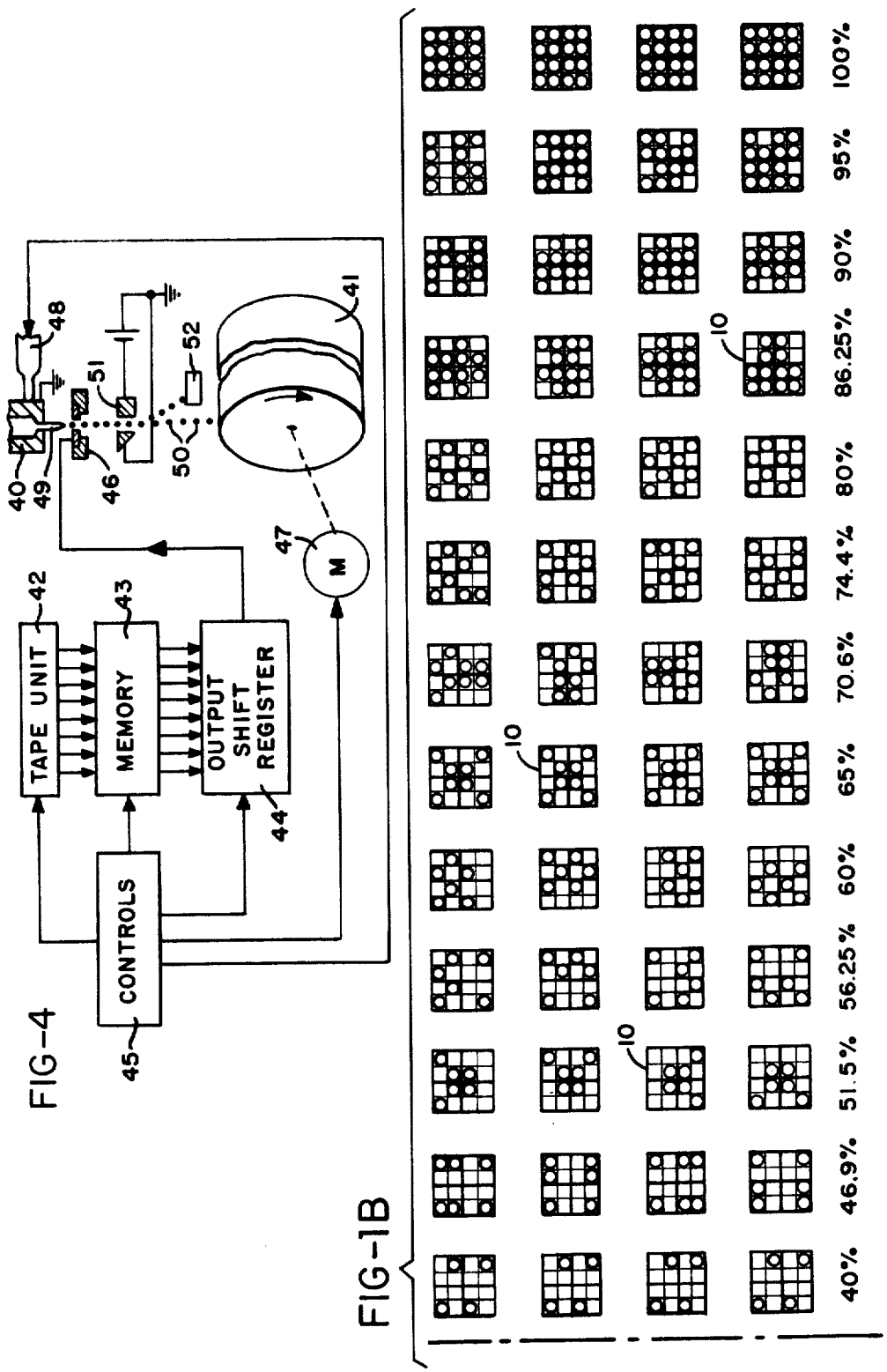

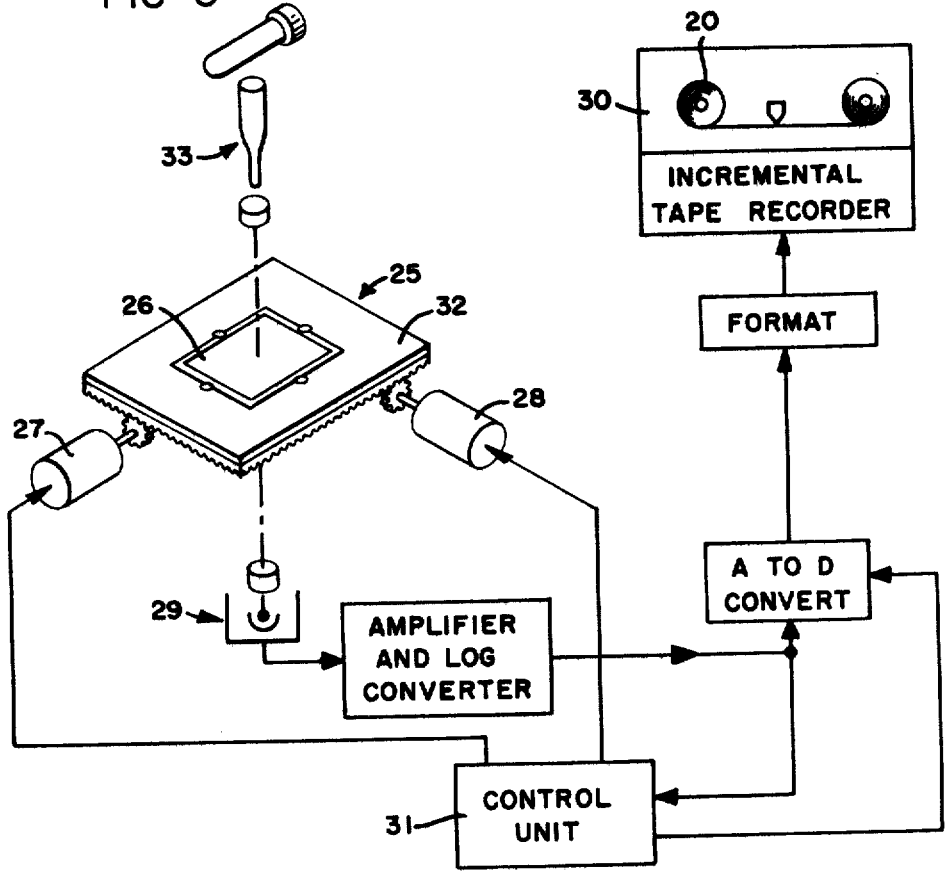
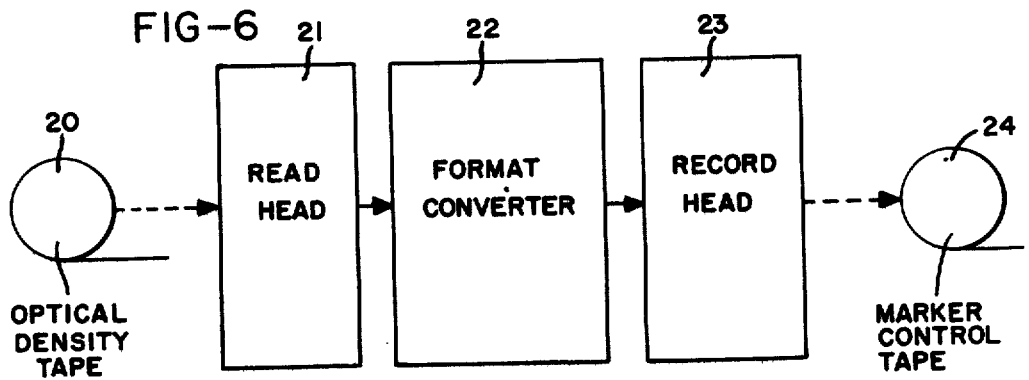

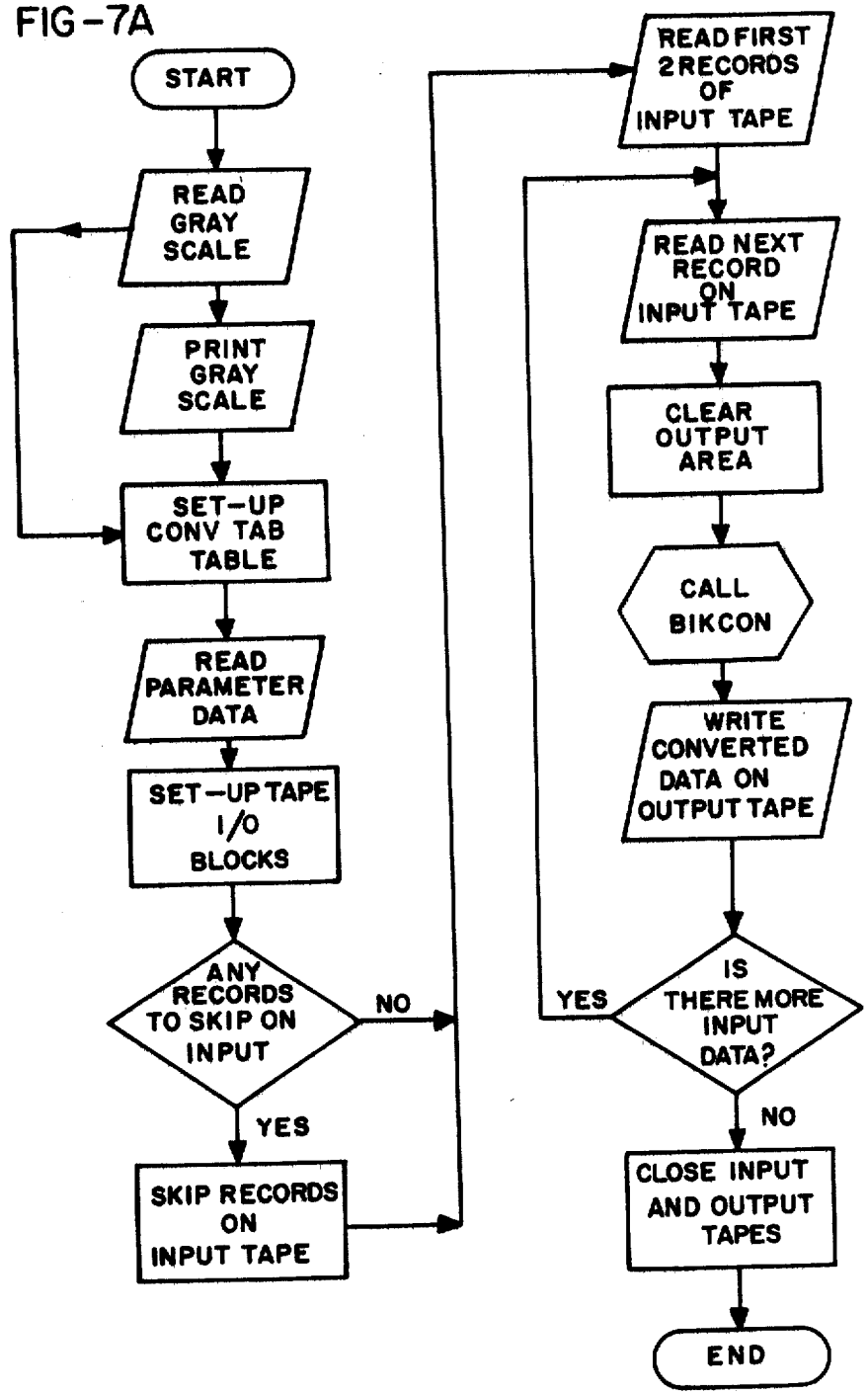

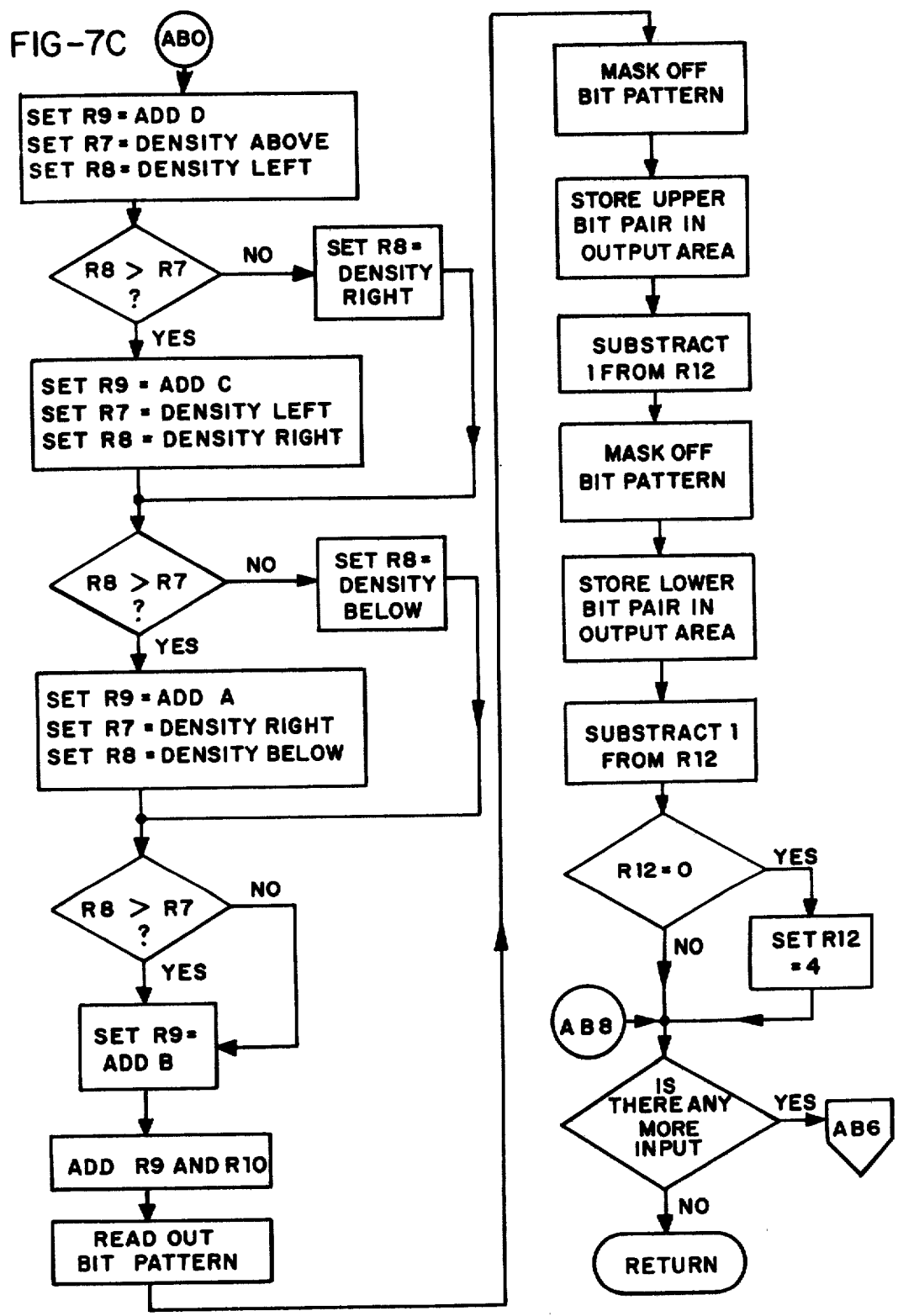

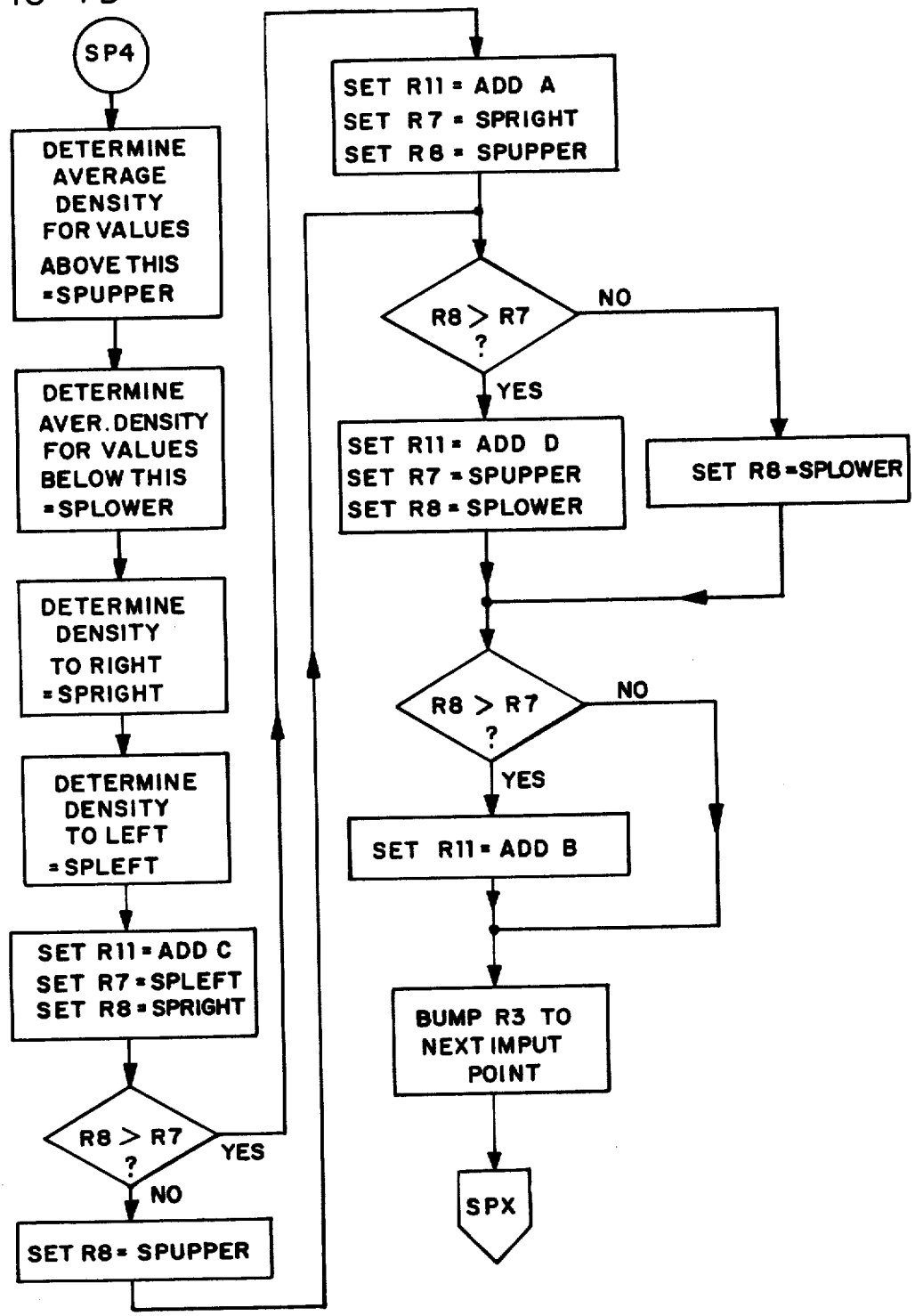

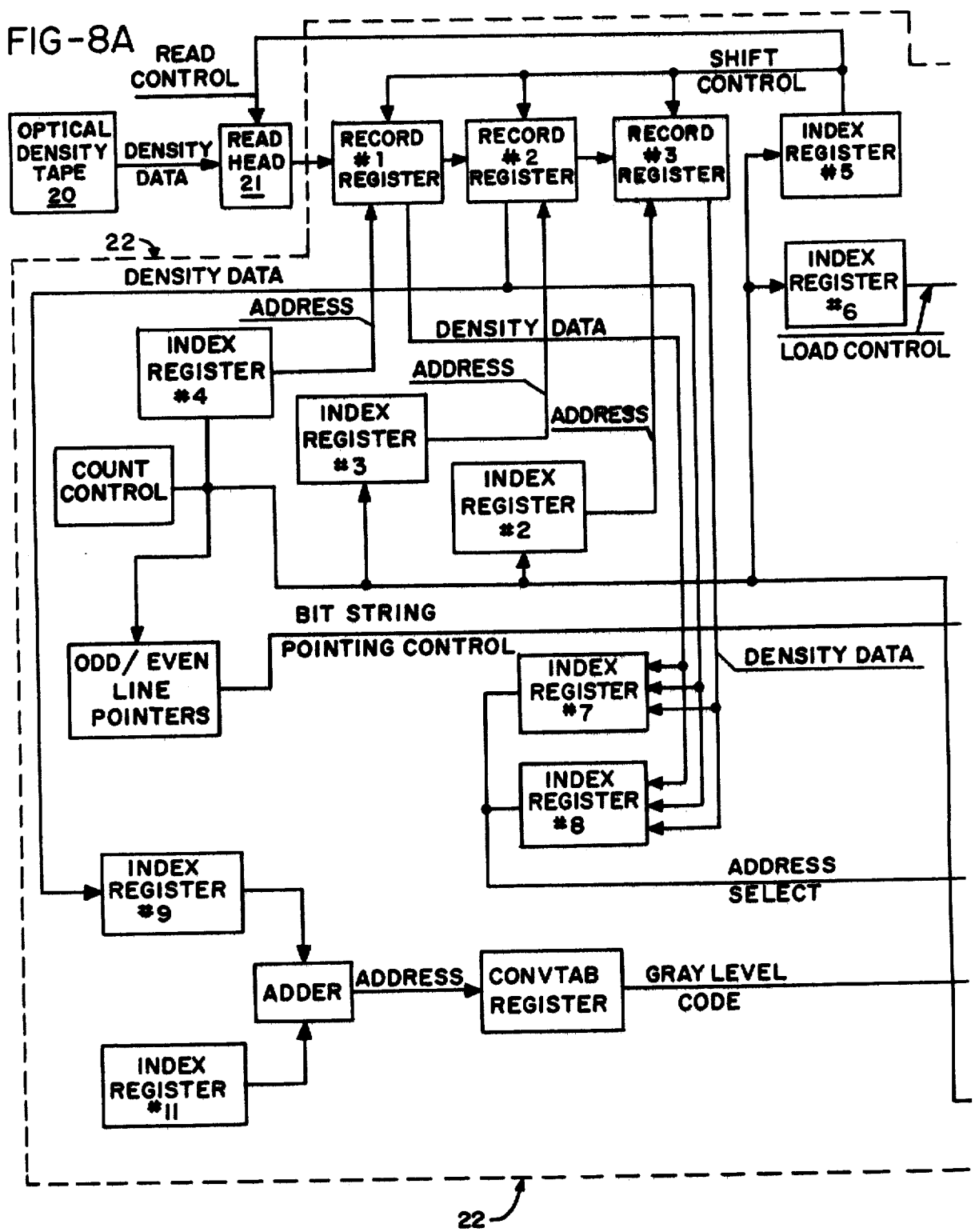

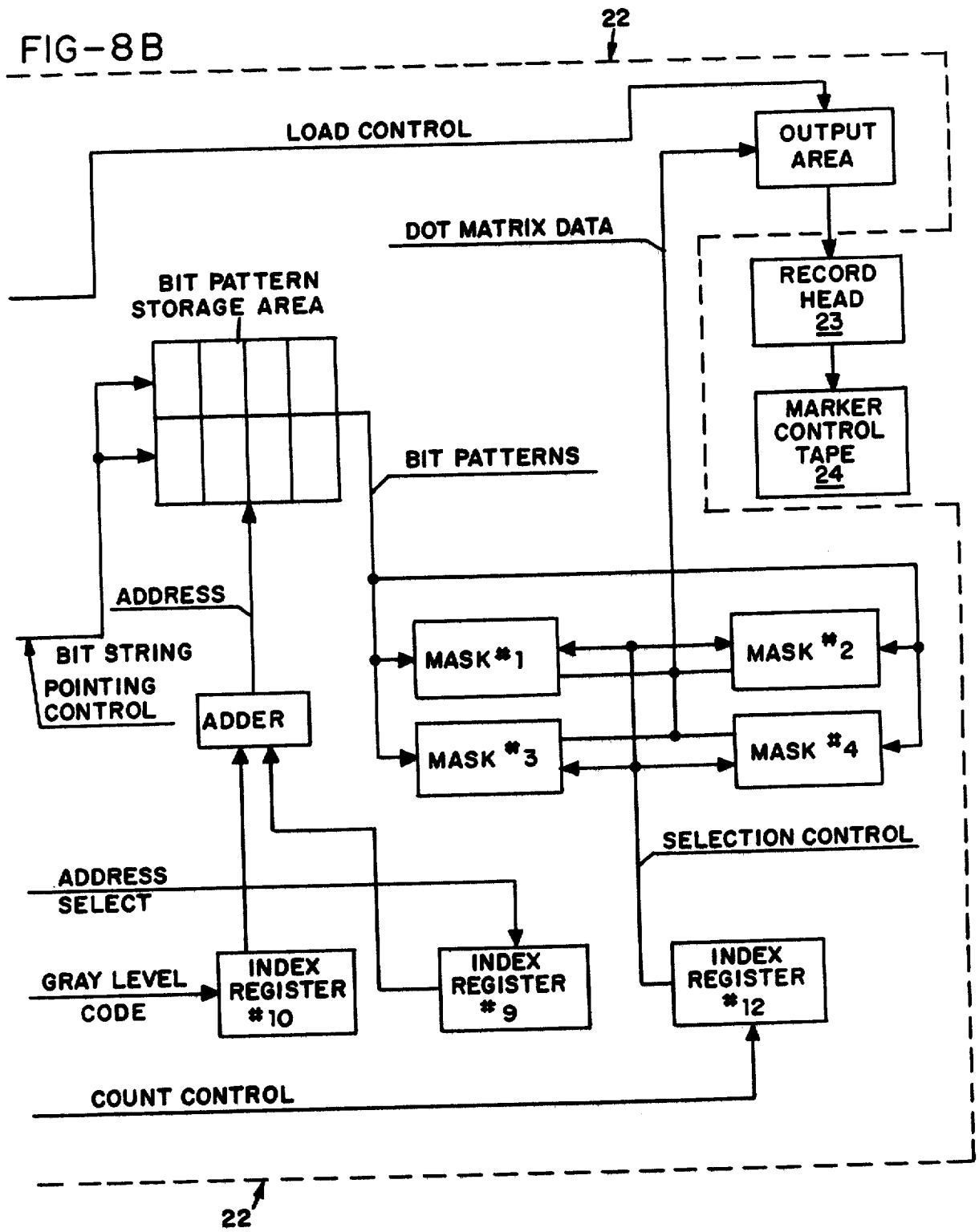

APPARATUS FOR DOT MATRIX RECORDING

CROSS REFERENCE TO RELATED APPLICATION

This application is a continuation-in-part of copending U.S. application Ser. No. 420,639, filed Nov. 30, 1973, now abandoned.

BACKGROUND OF THE INVENTION

This invention relates to reproduction of a range of gray levels as required by graphics arts applications. A common method of obtaining such gray levels involves the use of a halftone screen which causes the printing of dots having various sizes depending upon the gray level of the area represented by the dots. In facsimile applications wherein a halftone screen may not be employed, other gray level reproduction techniques have been used as described for example in Ranger, U.S. Pat. No. 1,848,840, Ernst U.S. Pat. No. 3,197,558, Young U.S. Pat. No. 3,294,896, McConnell U.S. Pat. No. 3,629,496, or in Klensch U.S. Pat. No. 3,580,995.

Another type of gray level reproduction to which this invention particularly relates is shown in Behane et al. U.S. Pat. No. 3,604,846. In the Behane patent gray level reproduction is accomplished by placing various numbers of uniformly sized dots within the cells of two-dimensional matrix. As described in detail in the Behane patent, an original representation such as a photographic negative or film positive is scanned optically, and density variations are reproduced electrically, converted to digital information, and recorded. The recorded information is then processed in a computer; the output produced being digital information representing a series of dots as required to construct a matrix print of appropriate optical density. The digital output information may be used to control any convenient ON/OFF marking device but preferably there is employed a binarily switched ink jet recorder as also disclosed in the Behane patent.

A significant limitation of an image reproduction system as disclosed in the Behane patent is the limited number of gray levels which may be obtained from a matrix of given size. For instance, a 3 by 3 matrix can only produce a total of only 10 gray levels, although most of the gray levels may be represented by several different dot arrangements. In those applications wherein more gray levels require reproduction it is necessary to increase the size of the matrix. Thus by increasing the matrix size to an 8 by 8 arrangement it becomes possible to reproduce a total of 65 gray levels running from white to black. Unfortunately, however, the matrix which is used for gray level reproduction is also the basic resolution element of the system, so that as the matrix increases to accommodate additional gray levels, the system resolution decreases. For instance the above mentioned 3 by 3 matrix which can accommodate 10 gray levels has a resolution of about 48 lines per inch when using a spacing of 0.0035 inches between matrix cells. On the other hand a 4 by 4 matrix of similar cell size gives 17 gray levels, but the resolution drops to about 36 lines per inch. Obviously this situation can be improved by decreasing the size of the matrix cells, but this also requires a decrease in the size of the printed dots. At this time it is not practical to produce a jet drop recorder which will print dots of a size very much smaller than about 0.0035 inches in diameter. Accordingly there has existed a requirement for a system which can reproduce a large number of gray levels in matrix form, but without undue degradation in resolution.

SUMMARY OF THE INVENTION

This invention enables reproduction of any desired number of gray levels by a dot matrix recorder while maintaining the resolution affordable by a small basic matrix such as by a 2 by 2 matrix. The conflicting requirements associated with high resolution recording and wide range gray scale reproduction are met by utilizing dot matrix groups comprising smaller dot matrices. The dot matrices which comprise any such group collectively enable reproduction of any one of a relatively large number of different gray levels, and when adjacent points within an original image have about the same optical density, then these adjacent points are collectively represented by such a matrix group. However, when adjacent points within the original image do not have the same optical density, then each point is represented by a single dot matrix selected from a dot matrix group of the appropriate gray level. In this latter case the system reproduces the optical densities of the two adjacent points only very approximately, but large changes in optical density are visibly apparent. Thus the system has relatively high resolution in image areas of high information content and accurate optical density reproduction in image areas of low information content.

Further in accordance with this invention the above mentioned dot matrices and dot matrix groups are reproduced by an ON/OFF recorder which may be a binarily switched ink jet recorder. Switching signals for the recorder may be generated by a magnetic tape or other marker control record carrying information bits arranged in correspondence with the marks which are to be made by the recorder. The bits recorded on the marker control record in turn are selected from bit patterns arranged in correspondence with the above mentioned dot matrix groups. These bit patterns are stored in a string within a suitable storage device and are retrieved on the basis of the optical densities of the points being reproduced. The selection of bits from these bit patterns is made in accordance with point to point changes in optical density. That is, whenever adjacent points have sufficiently similar optical densities to call for bit selection from the same bit pattern, then different bits are selected from the bit pattern in accordance with a predetermined sequence. This sequence continues until all bits within the bit pattern have been selected. Thereafter if there are more adjacent points having optical densities calling for bit selection from still the same bit pattern, than the sequence begins again.

Still in accordance with this invention there may be provided a plurality of strings of the above mentioned bit pattern, with each string representing the same set of gray levels, but by bit arrangements which differ from string to string. In applications wherein a plurality of strings of bit patterns are placed in storage there is made a string selection for each point to be reproduced, and an appropriate bit pattern is retrieved from this string. By this means it is possible to reduce patterning or moire effects. Preferably there are provided at least two such bit pattern strings for alternate usage in printing of even and odd numbered lines, and even more preferably eight or more bit pattern strings are provided. In the case wherein there are eight bit pattern strings, then the eight strings are divided into two groups for even and odd line printing. Selection from among the four bit pattern strings available for controlling the printing of a point in any given line may then be made on the basis of the optical density of the four points adjacent the point being printed. As an alternative, however, a selection from among a group of bit pattern strings available for controlling the printing of any point may be made in accordance with a random process.

It is accordingly an object of this invention to provide dot matrix recording apparatus which is able to record with high resolution in image areas of high information content and with accurate gray level reproduction in image areas of lower information content.

It is another object of this invention to provide apparatus and method for dot matrix recording with reduced patterning effects.

Still another object of this invention is to provide improved control means for a binarily switched ink jet recorder.

A further object of this invention is to provide improved apparatus and process for converting an optical density record into a marker control record.

Other objects and advantages of the invention will be apparent from the following description, the accompanying drawings and the appended claims.

BRIEF DESCRIPTION OF THE DRAWINGS

FIGS. 1A and 1B illustrate 4 sets of dot matrix groups for gray level reproduction;

FIG. 2 illustrates the component matrices of a matrix group;

FIG. 3 is an enlarged illustration of a dot matrix group as it may appear in printed material;

FIG. 4 illustrates a typical ink jet recorder for use in connection with this invention;

FIG. 5 illustrates scanning apparatus for producing an optical density tape;

FIG. 6 illustrates apparatus for converting an optical density tape to a marker control tape; and FIGS. 7A through 7E present a logic flow diagram for converting an optical density tape to a marker control tape.

FIGS. 8A and 8B present a block diagram of internal computer components as connected for operation as a format converter.

DESCRIPTION OF THE PREFERRED EMBODIMENTS

Figure 7B:
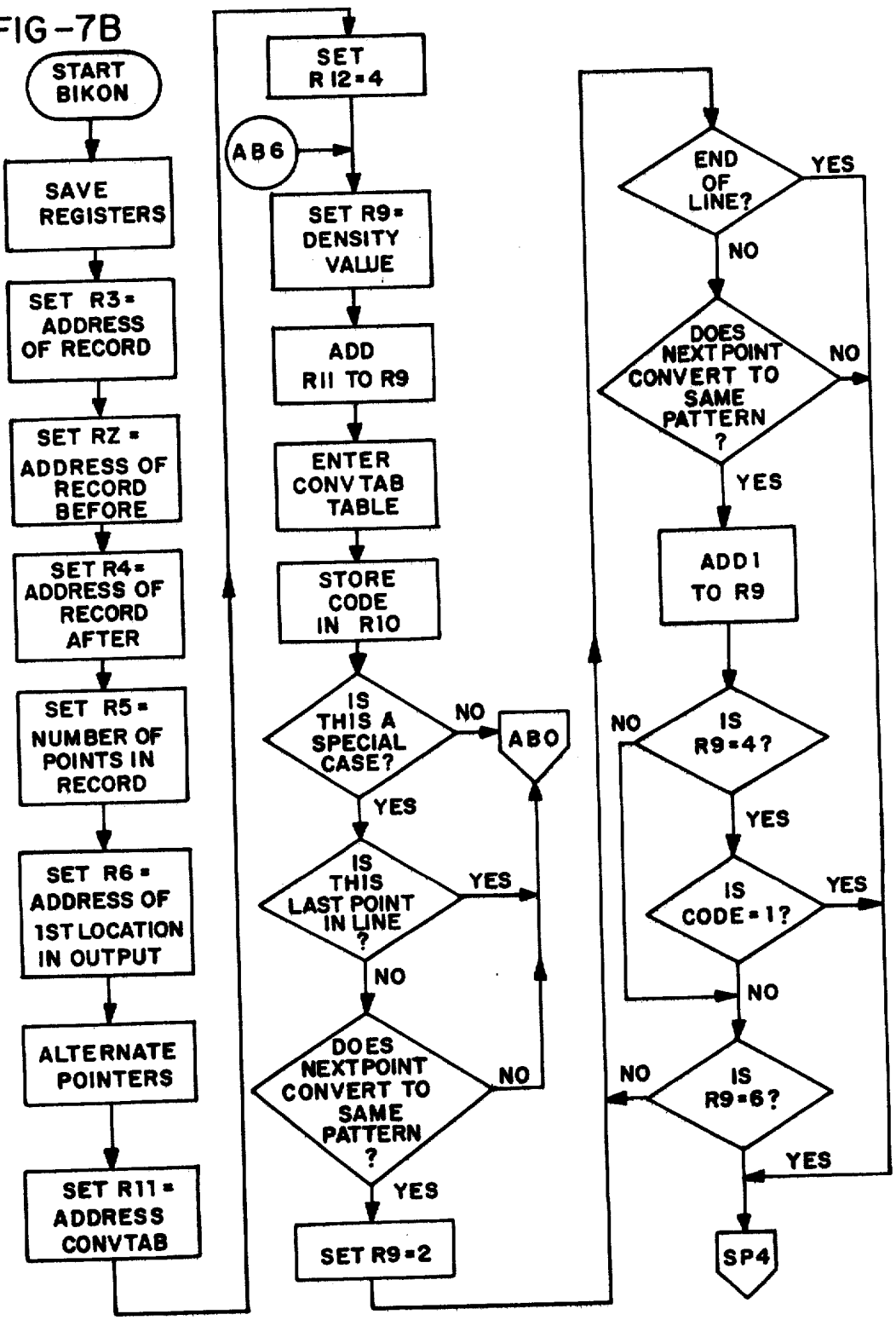

The preferred embodiment of this invention may reproduce gray scales by using one or more sets of dot matrices such as matrices A, B, C and D of FIGS. 1A and 1B. Each of these matrix sets comprises "non special" matrix groups 10 and "special" matrix groups 11 through 14. The matrix groups 10 through 14 all represent gray levels as indicated, but the matrix groups are not recorded as entire groups. Instead the gray scale reproduction is performed by recording smaller 2 by 2 matrices 15 which are selected from the larger matrix groups in accordance with a method discussed in detail below.

The recording of matrices 15 may be performed by any convenient ON/OFF dot marker, but preferably there is employed a digitally switched ink jet recorder as generally illustrated by FIG. 4. This apparatus, which is described in detail in Behane et al. U.S. Pat. No. 3,604,846 includes a drop generator 40, a rotating drum 41, a tape unit 42, a memory 43, an output shift register 44, and a control unit 45. The tape unit 42 reads a marker control tape 24 (FIG. 6) which contains information bits corresponding to dot arrangements in dot matrices 15, and loads these information bits into memory 43. The control unit controls the unloading of memory 43 into output shift register 44 for charging control of a charging electrode 46.

Control unit 45 also controls the speed of a drive motor 47 and the operating frequency of a stimulation transducer 48. Stimulation transducer 48 vibrates the drop generator 40 to cause breakup of an ink filament 49 into a stream of uniformly sized and regularly spaced drops 50. Drops 50 are charge coded in accordance with the information shifted out of shift register 44. Whenever a "1" is shifted out of register 44 a corresponding drop 50 is inductively charged by electrode 46, and whenever a "zero" is shifted out of register 44 a corresponding drop 50 separates from filament 49 in an uncharged condition. All of drops 50 pass between a pair of deflection electrodes 51, and those of drops 50 which are charged are deflected into a catcher 52.

A recording sheet is mounted on drum 41 for rotation therewith so that those of drops 50 which are uncharged deposit thereon. There is a stepping motor, not shown, which steps the ink generating and charging apparatus longitudinally of drum 41 once each revolution. Thus the drops 50 which are uncharged are able to reproduce any desired dot matrix pattern. It will be noted, however, that the 4 bits of information required for reproducing a 2 by 2 dot matrix cannot be loaded consecutively in shift register 44. In general 2 of these 4 bits will be loaded for consecutive shifting out from register 44 and the other 2 bits will be loaded for shifting out at the same point during the next rotation of drum 41. In a typical case wherein 16384 printing cells pass under drop generator 40 during each rotation of drum 41, the two bit pairs will be separated in storage by 2048 byte locations. In this way the recorder can record part of a 2 by 2 matrix during one revolution of drum 41 and complete the matrix during the next succeeding rotation.

Marker control tape 24, which controls, the pattern to be recorded by the recorder may be generated by apparatus as shown generally in FIG. 6. This apparatus, which includes a read head 21, a format converter 22, and a record head 23, reads an optical density tape 20 and converts the data so read into what may be termed bit matrix form. Optical density tape 20 in turn may be generated by apparatus such as that illustrated generally in FIG. 5, but tape 24 could be generated directly without generation of the intermediate tape 20.

The tape generating apparatus of FIG. 5 is already known in the art and is described in detail in Cahill U.S. Pat. No. 3,629,495. For an understanding of this invention it is sufficient to note that the apparatus generally comprises a scanning unit 25 having a table 32 which is driven in two coordinate directions by a pair of drive motors 27 and 28. An image carrying film 26 is mounted on table 32 for illumination by a light source 33, and the light which passes therethrough is sensed by a sensor 29. Sensor 29 generates an analog output signal which is digitized, formatted, and recorded by a recorder 30, all under the control of a control unit 31. As a result there is produced the optical density tape 20 which carries optical density information in digital form. The position of each digital word on tape 20 corresponds to the X, Y position of an associated point on the transparency 26.

Format converter 22, which converts the optical density information on tape 20 into bit matrix information for marker control tape 24, may be a special purpose digital computer or a general purpose digital computer such as for instance an IBM 370 computer adapted for the O.S. operating system. To operate as a format converter the computer is programmed so as to be internally configured for performing the operations outlined by the flow chart of FIGS. 7A through 7E. In general the sequence involves reading an optical density, selecting one of matrix sets A, B, C, or D of FIGS. 1A and 1B, picking out from the selected matrix set a matrix group corresponding to the optical density which has been read, and then recording a bit pattern corresponding to one of the 4 or more 2 by 2 matrices within the matrix group.

In general the matrix groups 10 through 14 of FIGS. 1A and 1B may be thought of as being similar to the matrices disclosed in the above mentioned Behane et al. patent. Such matrix groups may record as many discrete gray levels as desired by merely increasing the group size. In accordance with this invention the gray level capability of such large matrix groups is achieved without concomitant loss of resolution by recording on the above mentioned 2 by 2 matrix basis. That is, the recorder records from 0 to 4 dots within a 2 by 2 matrix as required by the density level being reproduced and will shift to a new dot pattern for the next 2 by 2 matrix. In image areas containing relatively little detail the 2 by 2 matrices will combine to produce the larger matrix groups.

A typical "non special" matrix group 10 is illustrated in enlarged form in FIG. 2. Such a matrix group 10 is seen to comprise four matrices 15 which are designated in FIG. 2 as I, II, III and IV. Each of these matrices 15 is a 2 by 2 matrix, that is, it comprises four matrix cells arranged in two rows of two cells each. The number and position of printed dots within any 2 by 2 matrix depends upon the group 10 to which the matrix 15 belongs as well as the position of the matrix within the matrix group. As mentioned above the matrix groups 10 through 14 are arranged into 4 sets A, B, C and D. Each of sets A through D comprises 17 matrix groups 10 for representation of 17 different gray levels and four larger matrix groups 11 through 14 for representation of four additional gray levels which are treated as special cases.

In accordance with this invention each new matrix 15 which is printed by the printer may belong to a different matrix group, so that the resolution afforded by a 2 by 2 matrix is preserved. Thus one matrix 15 may belong to a 0% gray scale group 10 and have no printed dots, while the next matrix may belong to a 100% gray scale group 10 and have four printed dots. This may be followed by another 0% gray scale matrix and so on.

Four adjacent matrices as illustrated by FIG. 2 cooperatively may reproduce any one of 17 different gray levels ranging from white to black. This is accomplished in accordance with the basic 2 by 2 scheme by assigning to each matrix 15 a designation I, II, III or IV depending upon the matrix position within the group 10. This designation may be made conveniently with reference to the position of the 2 by 2 matrix within the overall image being reproduced. Thus all matrices which occupy odd numbered positions within odd numbered print lines may be designated I, whereas even numbered matrix positions within odd numbered print lines may be designated II. For even numbered print lines the odd and even numbered matrix positions may be designated respectively III and IV.

The sequence for determining dot placement within any 2 by 2 matrix involves giving the matrix a designation as above described and also a gray scale group assignment. If for instance a matrix is designated III (odd numbered matrix position within an even numbered print line) and the associated matrix group is the 30% gray level group of set A, then there will be printed a single dot in the lower right hand cell of the matrix. It is apparent that the next matrix within the same printing line (left to right print direction) will be designated IV, so that if the required gray level is again 30% (and still assuming set A membership), then no dot will be printed in any of the four matrix cells. If the same conditions had obtained during the printing of matrices I and II of the line immediately above, then there would have been printed a dot in the lower left hand cell of matrix I and a dot in the upper right hand cell of matrix II. Thus the four adjacent matrices I through IV collectively will have dots printed in 3 of 16 possible cells. In reality the printed dots are somewhat larger than illustrated, so that 3 printed dots in a matrix group 10 actually represents a gray level of about 30%. A similar procedure is followed for printing of all of the other matrix groups 10. Again, it is emphasized that matrices I through IV may all belong to different gray level groups 10, which means that if a matrix I is to print at a 30% gray level (still assuming set A) and the next printed matrix on the same line is to print at the 65% gray level, then the first matrix will have a printed dot in its lower left hand cell and the next matrix (this being a matrix designated II) will have printed dots in both of its upper right and lower left cells. If the same 30 and 65% gray levels apply to the adjoining matrices in the printing lines immediately below, then there will again be selection of matrix patterns from different matrix groups, but this time the matrix designations will be III and IV. Such an arrangement of four adjoining matrices is illustrated in FIG. 3.

As mentioned above there are four special cases represented in each of sets A through D by matrix groupings 11, 12, 13 and 14. These special groupings enable the reproduction of gray levels of intermediate value, which cannot be reproduced by a four-matrix group such as the groups 10. The groups 10 enable reproduction of 17 gray levels from white to black, but by addition of special case groups, it is possible to reproduce as many gray levels as may be desired. Of course, the intermediate levels represented by the larger matrix groups provide accurate gray scale reproduction only in imaging areas having sufficient space for printing of the entire matrix group which represents that gray level. As described in more detail with regard to FIGS. 7A through 7G, the special case matrix groupings may be printed by simple extension of the procedure employed for printing of a non-special group 10.

Referring again to set A of FIGS. 1A and 1D, and noting in particular matrix group 12, it will be seen that a 15% gray level may be represented by printing one dot in each of the second and sixth matrices 15 in a group of six consecutive matrices in an odd numbered print line, and then printing a dot in the third matrix of the print line therebelow. However, if there are less than 6 consecutive points for which the recorded gray level is to be 15%, then only a part of the matrix group 12 is printed. The logic for accomplishing this partial usage of matrix group 12 is discussed below in connection with the description of FIG. 7E.

The four matrix sets A through D of FIGS. 1A and 1B are provided to avoid patterning effects, commonly called moire patterns, which result if a given gray level is always represented by the same dot pattern. There are therefore 84 different dot patterns stored in the computer for representation of the 21 different gray levels. The dot patterns employed by the different matrix groups may be arranged in a large number of different ways as desired for graphic quality of the imagery being reproduced, and the dot patterns illustrated in FIGS. 1A and 1B are merely representative. However, the patterns as illustrated have been found to provide reasonably high quality reproduction of a variety of types of images.

As noted above, whenever it is desired to print any particular gray level, selection may be made from one of four available matrix groups. To avoid inadvertent patterning effects it is desirable not to employ matrix groups from sets A, B, C and D in any repetitive sequence. Therefore, in accordance with this invention a matrix group selection is made on the basis of the optical density of the image points adjoining the point for which a matrix selection is being made. If the adjacent image point of greatest optical density is above the point of interest, then there will be recorded one of the 2 by 2 matrices from the appropriate matrix group within matrix set D. If the neighboring image point of greatest optical density is to the left of the point under consideration, then selection is made from set C. Selection is made from sets B and A for neighboring points of greatest optical density respectively below and to the right. It will be apparent that there may be employed more than four sets of matrix groupings and that other methods could be employed for set selection in connection with representation of gray levels at points within an image. For instance selection of a set could be made on a random basis by matching set numbers with numbers generated by a random process.

Referring now to FIGS. 7A through 7E there will be seen a flow chart for a computer program which may be employed in connection with the above described tape conversion. FIG 7A is a general flow chart including a program macro entitled BIKCON. FIGS. 7B through 7E present a flow chart for the BIKCON macro. The first step in the program illustrated by FIG. 7A is to read a gray scale into computer storage. This step causes designation of optical density ranges for each of the discrete gray levels which will be printed. In one successfully operated embodiment of the invention there are 256 such levels coded in digital form into density numbers ranging from 0 to 255. However, the reproduction process as described above in connection with FIGS. 1A and 1B permits printing of only 21 different gray levels (with capability for representing each of these gray levels by as many as four different dot patterns). Thus the "read gray scale" step involves setting up a table of optical density values corresponding with each of the dot matrix patterns to be printed. For example, it may be desirable to print one of the zero percent matrices of FIG. 1A whenever the input tape contains an optical density number in the range between 0 and 8. Similarly an appropriate 5% dot pattern may represent optical density numbers ranging between 9 and 18. The program allocates the entire 256 optical density levels to the 21 possible gray levels provided by the program. In general the human eye is more sensitive at the white end of the gray scale, so provision is made for "spreading out" the density levels at the lower end of the gray scale.

After the gray scale has been read into the computer, it is convenient to print out this data for documentation purposes. Thereafter the program sets up what is designated the CONVTAB table, which is in effect merely the reverse of the above mentioned gray scale table. Thus each time the computer is called upon to convert a new optical density, there is immediate selection of the appropriate one of the 21 possible printed gray levels.

The "read parameter data" step is a step wherein there is designated the portion of the input tape which is to be read. This makes it possible to print only a portion of a large image which may be represented by input tape 20. Thus the parameter data which is read in this step is data relating to the grid coordinates of the area to be printed.

After reading in of the parameter data the program sets up input and output blocks and determines whether any input tape records are to be skipped. Following this the program reads the first 2 records from the input tape. These 2 "records" are the optical density data for the first two image lines to be printed. Thereafter the program reads another record and continues reading 1 record at a time so that there are always three records in memory. This enables comparison of optical density at any point within a line with the optical density at adjacent points in the lines immediately above and below the line of interest.

After 3 records are read into memory, the program clears the output register to erase bit patterns generated by the previous program loop and proceeds to call the BIKCON macro. As illustrated by FIG. 7B the BIKCON macro begins by saving index registers in a save area so that they may be restored before returning to the calling program. The next step is to set into register 3 the address of the first density value in the row of densities to be coverted to bit patterns. Similarly register 2 is set to be the address of the first element in the preceding row, and register 4 is set to the address of the first element in the row immediately below the row to be converted. Register 5 is set to the number of elements in the record or row which is to be converted to bit patterns, and is used as a counter. Each time an optical density is converted into a matrix bit pattern the count in register 5 is decreased by one, and the counts in registers 2, 3, and 4 are all increased by an amount equal to the length of a density value word (8 bits). When the count in register 5 is zero, then the program exits from the BIKCON macro, reads a new record from the input tape, reenters BIKCON resets registers 2, 3, and 4, and begins converting density values for the new record.

The next step as illustrated in FIG. 7B is to set register 6 to the address of the first byte in the output area. Register 6 is a counter which controls the loading of the output area, which in one embodiment may accept 32,768 bits of data corresponding to the 32,768 dot printing positions which will be passed during two scan lines of the recorder of FIG. 4. Register 5 is reset each time the BIKCON macro is entered.

The bit patterns corresponding to matrix sets A, B, C or D are stored in eight strings; two strings for each of sets A, B, C and D. One string for each set contains bit patterns to be used in odd numbered printing rows (i.e. bit patterns for matrices corresponding to matrices I and II of FIG. 2), and the other string contains bit patterns to be used in even numbered printing rows (i.e. for matrices III and IV). For each of the eight strings of bit patterns there is an associated pointer which points to or designates the storage location of the first bit in the string. The pointers in turn are divided into two groups; one group for the odd lines and the other group for the even lines. The pointer groups are alternated each time the BIKCON macro is entered so that the correct bit patterns will be selected for odd and even numbered lines. Thus the first time through the BIKCON macro the odd numbered pointer group will be used, and consequently each time one of matrix sets A, B, C, or D is called for, the pointer will point to the bit-pattern string for the upper half of the appropriate matrix set. The next time through BIKCON the other set of pointers will be used and will call for bit pattern strings for the lower portions of the matrix sets. This alternation continues throughout the entire program.

Continuing with the chart on FIG. 7B, after the pointers have been alternated, register 11 is set to the starting address of the CONVTAB table. Then the program sets register 12 to four. Register 12 controls selection of a mask as described below and is decremented twice each time a new density value is converted to a matrix bit pattern. There are four masks employed and register 12 is reset to four every other time a new density value is read.

After setting of register 12 the program enters a loop which will be followed for each input density that is to be converted to a bit pattern. First the density value is loaded into register 9. Then the contents of register 9 are added to the contents of register 11 and the sum thereof is used for entry into the CONVTAB table. The output from the CONVTAB table is a coded binary number corresponding to one of the 21 gray levels which are reproducible by matrix sets A, B, C and D. This code is stored in register 10. After the CONVTAB table output has been stored in register 10 the program checks to see if this is a special case. The special cases are the density values being converted to the 5 percent 15 percent, 25 percent or 35 percent gray levels, each of which is represented by its own binary code word in register 10. These particular gray levels are represented by the matrix groups 11, 12, 13, and 14 of FIG. 1A. If the program determines that it is working on a special case it continues along the flow. path shown in FIG. 7B. However, if the program determines that it is not working on a special case it enters the logic path beginning at the top of FIG. 7C.

In general the logic for the special cases is quite similar to the logic for the non special cases as set out in FIG. 7C. In the typical non special case the selection of a bit pattern corresponding to one of matrices 15 within a matrix group 10 from one of matrix sets A, B, C, or D begins by setting in register 9 the address of the storage location for the first bit pattern of the string of bit patterns corresponding to the matrix set D. Then register 7 is set equal to the optical density value for the corresponding point in the preceding record (as noted above the program reads into storage both the record preceding and the record following each record being converted to bit patterns), and register 8 is set equal to the optical density value for the point immediately preceding (to the left of) the point for which a bit pattern is being generated. The program then checks to determine whether the density value stored in register 8 exceeds the density value stored in register 7. In effect this step determines whether the optical density for the point to the left of the point of interest exceeds the optical density for the point immediately above the point of interest. If the point to the left has an optical density which exceeds the optical density to the point above, then register 9 is set with the address of the storage location for the first bit pattern of the string of bit patterns corresponding to the matrix set C. Also in such event register 8 is set equal to the optical density for the point to the right of the point of interest, and register 7 is set equal to the optical density for the point to the left of the point of interest. If, however, the optical density for the point to the left of the point of interest does not exceed the optical density of the point above the point of interest, then the contents of registers 7 and 9 are left unchanged, and register 8 is set equal to the optical density of the point to the right of the point of interest. The program then continues with the logic sequence shown in FIG. 7C until it reaches the step entitled "ADD R9 AND R10". When the program has reached this point, register 9 has been set with the address of the storage location for the first bit pattern of a bit pattern string corresponding to the upper or lower portion of one of matrix sets D, C, A, or B depending upon whether the point of interest is in an odd or even line and whether the adjacent point of greatest optical density is respectively above, to the left, to the right, or below the point of interest.

Each of the bit pattern strings which may be pointed to by register 9 contains a bit pattern for each of the non special case gray levels and a plurality of bit patterns for each of the special case gray levels. The actual number of bit patterns associated with a special case gray level depends upon the size of the corresponding matrix group as illustrated in FIG. 1A. Thus the matrix groups 11, which represent a 5% gray level, are twice the size of matrix groups 10 and are therefore represented by 2 bit patterns. Similarly the matrix groups 12, 13, and 14 are three times the size of matrix groups 10 and accordingly are represented by 3 bit patterns. As discussed below, each bit pattern contains enough information for recording two side by side matrices 15, so a group of bit patterns associated with one of matrix groups 11 may control gray level recording for as many as 4 side-by-side points having a 5% gray level. In the case of the bit pattern groups associated with matrix groups 12, 13, and 14, there is stored sufficient information for gray scale control of as many as 6 side-by-side points to be recorded.

It will now be understood that each of the eight bit pattern strings contains a total of 28 bit patterns for representing the upper or lower half of recorded areas having any one of 21 different gray levels. Further it will be seen that the code stored in register 10 is merely a pointer which points to a bit pattern position within a bit pattern string. Thus if the above mentioned CONVTAB table entry has produced a 0% gray scale result, then the code stored in register 10 will be 0. For a 5% gray scale the code will be 1, and for a 10% gray scale the code is 3 (since two bit patterns are required for representation of a full 5% gray scale area). The codes for each of the other gray levels may be easily determined by referring to FIGS. 1A and 1B and merely counting pairs of 2 by 2 matrices from left to right (but noting as above mentioned that the first pair of matrices is assigned the code number 0).

Now returning to FIG. 7C, it will be seen that the step entitled "ADD R9 and R10" results in a number which points to the storage location of a bit pattern which meets the above mentioned gray scale and matrix set criteria. This bit pattern may be an 8-bit word with zeros and ones corresponding to the 8 matrix positions in matrices I and II of FIG. 2 (pointers of FIG. 7B set for an odd line) or the 8 matrix positions in matrices III and IV (pointers set for an even line). However, only 4 of these bits will be moved to the output area, and these 4 bits will be moved out as pairs in two separate steps. If the point for which a gray scale conversion is being made is an odd numbered point within its line, then the first and third pairs of bits from the 8-bit pattern will be transferred, while the second and fourth pairs of bits will be transferred in the case of a point occupying an even numbered position in within its line.

The transfer of the appropriate bits from the selected bit pattern is controlled by a masking routine wherein one of four masks (as pointed to by register 12) is matched against the bit pattern on an AND gating basis. The four masks have bit values of 11000000, 00001100, 00110000, and 00000011 corresponding respectively to an odd point (top two cells), an even point (top two cells), an odd point (bottom two cells), and an even point (bottom two cells). The first time through the loop register 12 is set to 4 as mentioned above. This causes selection of the mask 11000000, and consequently the first two bits will be gated out of the selected bit pattern. These will be the bits for the top two cells of a matrix I, since the first point converted is an odd numbered point within an odd numbered line. For the special case illustrated in FIG. 3 these two bits will be zeros, and placement of those two zeros in the output area will be controlled by the address set into register 6.

After the first two bits are transferred into the output area the count in register 12 is decreased by 1 to select the mask 00001100. This mask then is used to gate out from the selected bit pattern a second pair of bits for controlling the marking of the bottom two cells of the matrix I. Again referring to the example of FIG. 3, the bit pair will be "1,0". This pair then is also transferred to the output area, but it will not be stored adjacent to the first above mentioned bit pair. The reason for this is that the recorder, as above described, records only one row of cells at a time; two complete revolutions of drum 41 being required for recording the row of matrices 15 which correspond to one scan line across the transparency 26. Thus the second bit pair is displaced in storage 2048 byte locations from the first bit pair.

After the second bit pair has been transferred to the output area the count in register 9 is again decreased, so that the next time through the loop the program will utilize the two "even point" masks. As shown by FIG. 7C, the program resets register 12 back to a count of 4 whenever the count therein reaches zero (which can happen only after the second masking operation of any program loop). Then after checking the setting of register 12, the program returns to the point AB6 of FIG. 7B for conversion of the next density value. This looping back for conversion of new density values continues until the last point in the print line is reached. Thereafter the program exits from the BIKCON macro and returns to the main program illustrated on FIG. 7A. The main program then causes the converted data to be recorded on marker control tape 24, and a new record is read from optical density tape 20.

It will be understood that the loading of data bits into the output area presents centain problems which have not been mentioned in the above discussion. In particular the output area for the case of this example contains storage for 4096 8-bit bytes representing printing control information for two lines of 16,384 marking cells each, and only these 4096 byte locations may be individually addressed. Thus it is necessary to take special steps to load the above mentioned bit pairs into the correct positions within the output data bytes. For each output data byte this involves taking the 8-bit words which result from the above described masking process and matching those words on an OR basis against the data already in the output data byte. Initially, therefore each output data byte has the form 00000000 and this is matched against a word having the form XX000000, where each X denotes either a zero or a one depending upon the information content of the bit pair, which has been masked out from one of the above mentioned bit patterns. This produces a word of the form XX000000, which is then matched on an OR basis against a new word having the form 00XX0000 and derived from another masking step. The process continues until the output data byte is filled.

Now referring back to the discussion of the masking process which produces bit pairs for the output area, it will be seen that while the first masking operation produces a word of the form XX000000, the next masking operation produces a word of the form 0000XX00. The bits represented by these latter X's must be loaded into output data byte member 2049, and they must be loaded into the first two positions within that byte, if registration of the printed dot matrix is to be achieved. Accordingly the data bits resulting from the second masking step must be shifted to produce a new word of the form XX000000 for OR gating and loading into byte No. 2049. Following through with the loading of the output area, it will be seen that additional bit position shifting is required as pairs of bits are alternately loaded into output bytes 1 and 2049. Thereafter a similar procedure is followed in loading output bytes 2 and 2050, and so on until bytes 2048 and 4096 have been filled.

As an alternative to the above mentioned bit position shifting, the information within the bit patterns can be repeated so that a pattern with 8 positions 1, 2, 3, 4, 5, 6, 7, 8 is transformed into two corresponding patterns or words A and B wherein the information in word A corresponds to pattern positions 1, 2, 3, 4, 1, 2, 3, 4 while the information in word B corresponds to pattern positions 5, 6, 7, 8, 5, 6, 7, 8. These words may then be alternately masked in sequence by masks of the form 11000000, 11000000, 00110000, 00110000, 00001100, 00001100, 00000011, 00000011. The data bytes which are obtained by AND gating against the above masks in the stated sequence may then be OR gated on an alternate basis directly into output data bytes which are separated in storage by 2048 locations. Obviously if this alternate procedure is employed, then certain minor modifications must be made to the logic sequence outlined in FIG. 7C. The internal computer connections as above described for accomplishing format conversion in non-special cases is illustrated in block diagram form in FIGS. 8A and 8B.

Referring again to FIG. 7B, whenever the code in register 10 indicates that the program is converting a "special case" optical density, then the program checks to ascertain whether it is working on the last point in a line. If so, or if the next point converts to a different matrix pattern, then the program again follows the logic of FIG. 7C which will result in a matrix conversion based upon only the first bit pattern in the bit pattern group associated with the special case gray scale.

If it is determined that the program is not working on the last point in a line and if the next point converts to the same pattern, then register 9 is set equal to 2. Thereafter the program continues checking ahead for other points which convert to the same pattern and adds one to register 9 for each such point. Thus register 9 keeps track of the number of points which convert to the pattern being generated. When register 9 is set equal to four, then the program checks to determine whether the code stored in register 10 is equal to one. If this code is equal to one, it means that a 5% gray level is to be printed, and therefore only four 2 by 2 matrices will be required for representation of the gray level. If the code in register 10 is not equal to one when register 9 is equal to 4, then register 9 continues to be incremented until one of three events occurs. These three events are: reaching the end of a print line, reaching a point which does not covert to the same pattern, and reaching a condition wherein register 9 is equal to 6. When any one of these events occurs the program branches to the routine illustrated generally at FIG. 7D.

In general the logic of FIG. 7D is very similar to the logic of FIG. 7C which has been discussed above. The object of the routine illustrated in FIG. 7D is to set into register 11 the address of the storage location for the first bit pattern of a bit pattern string corresponding to one of matrix sets A, B, C, or D. The matrix set which is chosen will depend upon whether the adjacent area of greatest optical density is to the right, below, to the left, or above the special case points under consideration. For the "non special" cases as discussed above, the program only examines the optical density for 4 points adjacent a point of interest. However, in the special cases for which the logic of FIG. 7D applies, there must be an examination of the optical density for one point to the left, one point to the right, as many as 6 points above, and as many as 6 points below the area of interest. The contents of register 9 specify the number of consecutive points which will be converted together, and this in turn determines the number of points above and below over which density values must be averaged. The special case routines for determining the 4 adjacent optical densities are named SPUPPER, SPLOWER, SPRIGHT, and SPLEFT.

Figure 7E:
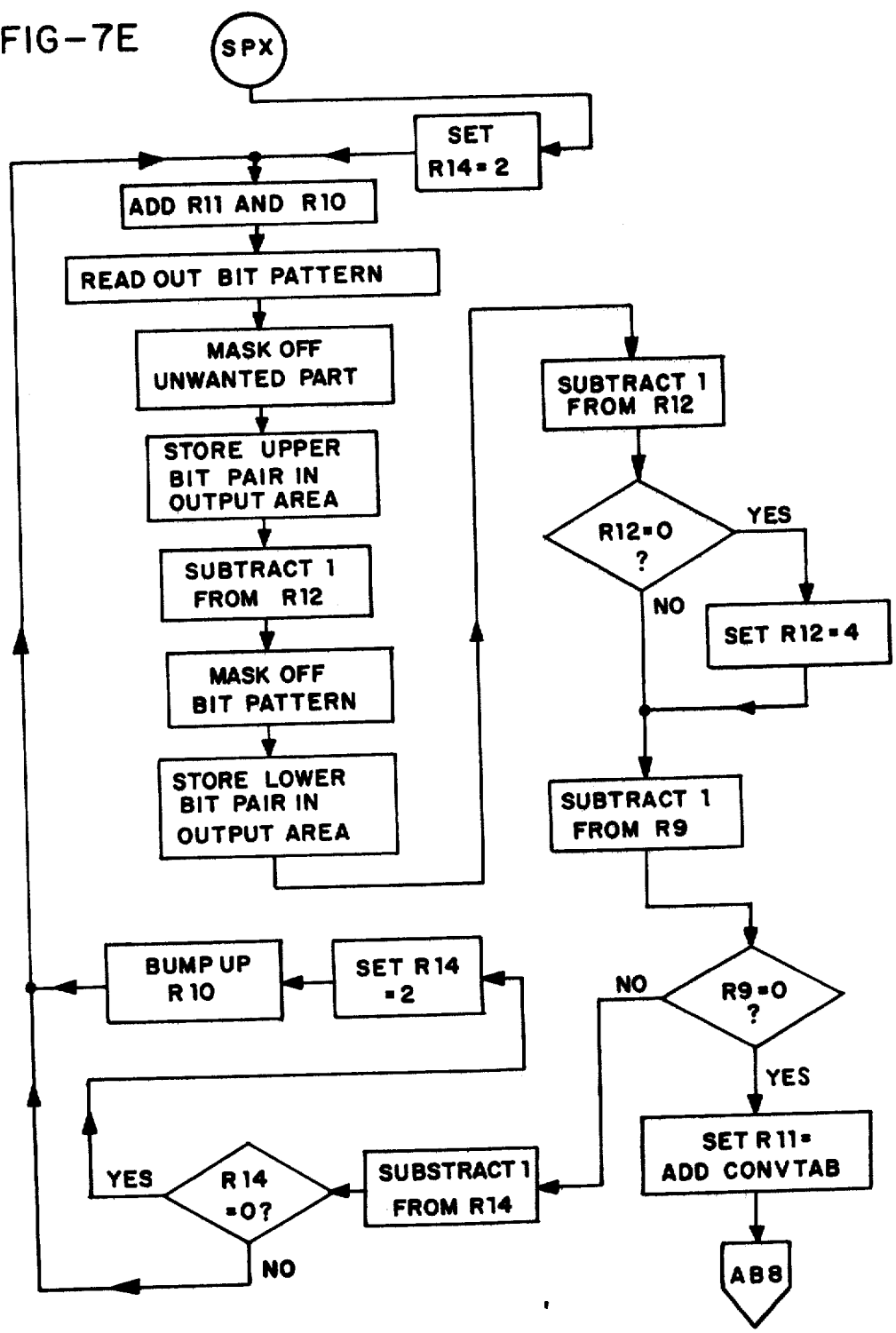

After the special case routine has selected a bit pattern string corresponding to the correct one of matrix sets A, B, C, or D and has stored the appropriate address in register 11, then the program bumps up register 3 to the next input point which will require conversion upon completion of the special case routine. Again the contents of register 9 indicate how far ahead register 3 should be bumped. Thereafter the program proceeds as illustrated by FIG. 7E, to move the correct bit pairs to the output area.

The first step in the bit pattern movement sequence is to set register 14 equal to 2, and this is done for reasons which will presently become apparent. Then the address of the first bit pattern to be moved to the output area is determined by adding the contents of register 11 to the contents of register 10. Actual movement of bit patterns is accomplished in a manner similar to the movement described above in connection with the "non special" cases. However, for the special cases it is necessary to move additional bit patterns to the output area, the number of such transfers depending upon the number which is stored in register 9.

The program proceeds with the bit transfer by first reading out the correct bit pattern (eight bit word) from one of the above mentioned eight bit pattern strings, and the address of this bit pattern is determined by adding the contents of registers 10 and 11. This bit pattern is masked twice by the above mentioned masks to obtain two bit pairs (again representing masking information for the upper and lower cells of a 2 by 2 matrix), and the bit pairs are transferred to the output area. Again it is necessary to follow a bit position shifting routine, unless there is followed an alternate masking procedure analogous to the procedure described above in connection with the "non special" case.

After the first two bit pairs have been transferred, and the count in register 12 (which again points to one of the 4 masks) has been correspondingly decreased, the program repeats the loop to pick up the remaining two masks and transfers two more bit pairs to the output area. This double looping is required, because, as mentioned above, each bit pattern contains matrix data for two adjacent 2 by 2 matrices. Each time through the loop the program decreases the count in register 9, and when this count goes to zero, the special case has been completed.

After the program has looped twice through the routine of FIG. 7E, register 10 is bumped up to cause reading out of a new bit pattern. Thus for those special cases wherein register 9 starts with a count of 6, register 10 will be bumped up 3 times and 3 bit patterns will be read from sequential locations within the storage for the selected bit pattern string. In order to cause bumping up of register 10 only every other time through the loop, the count in register 14 is adjusted as illustrated and the program performs the bumping only when the count in register 14 is zero.

The entire process as discussed above with reference to FIGS. 7A through 7E continues until all of the optical density data has been read out from tape 20 and has been converted to marker control data for tape 24. It will be appreciated, however, that the marker control data which is so generated need not be recorded on marker control tape 24, but could be used for direct control of a recorder such as the recorder of FIG. 4. For such an alternative embodiment it would be necessary only that read head 21 read the optical density tape 20 in synchronism with the motion of the marking recorder and that format converter 22 operate at a speed compatible therewith. Also as mentioned above the scanner of FIG. 5 could generate marker control tape 20 directly, or in still another embodiment the scanning apparatus and the marking recorder could both be connected to format converter 22 for on-line control of the dot marking process.

Tables I and II below contain a program listing for a computer program written in accordance with the flow charts of FIGS. 7A through 7E. Table I is a listing for the main program as set forth by FIG. 7A and is written in Fortram IV G, Level 21. Table II is a listing for the BIKCON macro as set forth by FIG. 7B through 7E and is written in IBM Assembly Lanugage. The program as listed in Tables I and II has been successfully run on an IBM 370 computer system and has produced output tapes (marker control tapes 24) which in turn have controlled an ink jet recording system of the type shown in FIG. 4. Under such control the ink jet recorder successfully reproduced images in accordance with this invention.

While the methods herein described, and the forms of apparatus for carrying these materials into effect, constitute preferred embodiments of the invention, it is to be understood that the invention is not limited to these precise methods and forms of apparatus, and that changes may be made in either without departing from the scope of the invention.

TABLE I

```
FORTRAN IV G LEVEL  21

C PGM=BIK2X2    ,V= 1,M= 1
0001          COMMON ICONV(256)
0002          INTEGER*2 ICONV
0003          DIMENSION OUT(1024)
0004          LOGICAL*1 IN(24582)
0005          DIMENSION ITI(16),ITO(16)
0006          INTEGER OUT
        C     FILL UP CONVERT TABLE
0007      5   READ(1,1) IVAL,IMIN,IMAX
0008          WRITE(3,3) IVAL,IMIN,IMAX
0009      3   FORMAT(1X,3I5)
0010          IVAL=IVAL-1
0011          I1=IMIN+1
0012          I2=IMAX+1
0013          DO 30 I=I1,I2
0014          ICONV(I)=IVAL
0015     30   CONTINUE
0016          IF(IMAX .LT. 255) GO TO 5
0017          READ(1,2) LEN,NP,NPS,NRS,NR
0018      2   FORMAT(5I5)
0019      1   FORMAT(3I5)
0020          LEN=NP
0021          LENO=2048
0022          CALL TPREAD(1,IN,LEN,CODE,NREAD)
0023          CALL TPRITE(1,IN,LEN)
0024          I1=1
0025          I2=NP+1
0026          I3=I2+NP
0027          NLINE=NR-2
0028          CALL TPREAD(2,IN(I1),LEN,CODE,NREAD)
0029          CALL TPREAD(2,IN(I2),LEN,CODE,NREAD)
0030          DO 200 NN=1,NLINE
0031          CALL TPREAD(2,IN(I3),LEN,CODE,NREAD)
0032          DO 190 I=1,1024
0033    190   OUT(I)=0
0034          CALL BIKCON(IN(I1),IN(I2),IN(I3),NP,OUT)
0035          CALL TPRITE(2,OUT,LENO)
0036          CALL TPRITE(2,OUT(513),LENO)
0037          IS=I1
0038          I1=I2
0039          I2=I3
0040          I3=IS
0041    200   CONTINUE
0042          CALL TPREAD(3,IN,LEN,CODE,NREAD)
0043          CALL TPRITE(3,IN,LEN)
0044          END
```

TABLE II

OS BIKCON ROUTINE

```
LOC    OBJECT CODE    ADDR1 ADDR2  STMT   SOURCE STATEMENT 000000                              3  BIKCON  START  0
000000                              4  R0      EQU    0
000001                              5  R1      EQU    1
000002                              6  R2      EQU    2
000003                              7  R3      EQU    3
000004                              8  R4      EQU    4
000005                              9  R5      EQU    5
000006                             10  R6      EQU    6
000007                             11  R7      EQU    7
000008                             12  R8      EQU    8
000009                             13  R9      EQU    9
00000A                             14  R10     EQU    10
00000B                             15  R11     EQU    11
00000C                             16  R12     EQU    12
00000D                             17  R13     EQU    13
00000E                             18  R14     EQU    14
00000F                             19  R15     EQU    15
                                   20          USING  *,R15
000000 47FF 000C           0000C   21          BC     15,7+1+4(15)    BRANCH AROUND CONSTANTS IN CALLING
                                   22 *                               SEQUENCE
000004 07                          23          DC     X'07'           MUST BE ODD INTEGER TO INSURE THAT
                                   24 *                               THE PROGRAM
000005 C2C9D2C3D6D540              25          DC     CL7'BIKCON '    STARTS ON A HALF-WORD BOUNDRY.
00000C 90EC 000C           0000C   26          STM    14,12,12(13)    THE CONTENTS OF REGISTERS
                                   27 *                               14, 15, AND 0 THROUGH 12 ARE STORED IN
                                   28 *                               THE SAVE AREA OF THE CALLING PROGRAM.
000010 9826 1000           00000   29          LM     R2,R6,0(1)
                                   30 *        R2 IS ADDRESS OF LINE BEFORE
                                   31 *        R3 IS ADDRESS OF LINE
                                   32 *        R4 IS ADDRESS OF LINE AFTER
                                   33 *        R6 IS ADDRESS OF OUTPUT
000014 5855 0000           00000   34          L      R5,0(R5)
                                   35 *        R5 CONTAINS NUMBER OF POINTS PER LINE
000018 D20F F254 F214 00254 00214  36          MVC    SAVEL(16),UPPER
00001E D20F F214 F224 00214 00224  37          MVC    UPPER(16),EVENLINE
000024 D20F F224 F254 00224 00254  38          MVC    EVENLINE(16),SAVEL
00002A D20F F254 F234 00254 00234  39          MVC    SAVEL(16),SPUPPER
000030 D20F F234 F244 00234 00244  40          MVC    SPUPPER(16),SPEVLINE
000036 D20F F244 F254 00244 00254  41          MVC    SPEVLINE(16),SAVEL
00003C 58B0 F4C8           004C8   42          L      R11,=A(CONVTAB)
000040 4110 0001           00001   43          LA     R1,1
000044 41C0 0004           00004   44  AB5     LA     R12,4
                                   45 *        PICK-UP DENSITY VALUE
000048 1B99                        46  AB6     SR     R9,R9
00004A 4393 0001           00001   47          IC     R9,1(R3)
00004E 1499                        48          AR     R9,R9
000050 4AA9 B000           00000   49          LH     R10,0(R9,R11)
000054 59A0 F1F4           001F4   50          C      R10,S240
000058 4720 F0DE           000DE   51          BH     SPECIAL
00005C 1B88                        52  AB0     SR     R8,R8
00005E 1B77                        53          SR     R7,R7
000060 1AAA                        54          AR     R10,R10
```

TABLE II

```
000062 5890 F214        00214   55          L      R9,UPPER
000066 4382 0001        00001   56          IC     R8,1(R2)
00006A 4373 0000        00000   57          IC     R7,0(R3)
00006E 1987                     58          CR     R8,R7
000070 4720 F07A        0007A   59          BH     AB1
000074 5890 F218        00218   60          L      R9,LEFT
000078 1887                     61          LR     R8,R7
00007A 4373 0002        00002   62 AB1      IC     R7,2(R3)
00007E 1987                     63          CR     R8,R7
000080 4720 F08A        0008A   64          BH     AB2
000084 5890 F21C        0021C   65          L      R9,RIGHT
000088 1887                     66          LR     R8,R7
00008A 4374 0001        00001   67 AB2      IC     R7,1(R4)
00008E 1987                     68          CR     R8,R7
000090 4720 F09A        0009A   69          BH     AB3
000094 5890 F220        00220   70          L      R9,LOWER
000098 4379 A000        00000   71 AB3      IC     R7,0(R9,R10)
00009C 438C F1F7        001F7   72          IC     R8,MASK-1(R12)
0000A0 1478                     73          NR     R7,R8
0000A2 4386 0000        00000   74          IC     R8,0(R6)
0000A6 1678                     75          OR     R7,R8
0000A8 4276 0000        00000   76          STC    R7,0(R6)
0000AC 4379 A001        00001   77          IC     R7,1(R9,R10)
0000B0 438C F1F7        001F7   78          IC     R8,MASK-1(R12)
0000B4 1478                     79          NR     R7,R8
0000B6 4386 0800        00800   80          IC     R8,2048(R6)
0000BA 1678                     81          OR     R7,R8
0000BC 4276 0800        00800   82          STC    R7,2048(R6)
0000C0 1A21                     83          AR     R2,R1
0000C2 1A31                     84          AR     R3,R1
0000C4 1A41                     85          AR     R4,R1
0000C6 46C0 F000        00000   86          BCT    R12,AB8
0000CA 41C0 0004        00004   87          LA     R12,4
0000CE 1A61                     88          AR     R6,R1
0000D0 4650 F048        00048   89 AB8      BCT    R5,AB6
0000D4 98AC D01C        0001C   90 ENDIT    LM     2,12,28(13)     RESTORE REGISTERS
0000D8 92FF D00C   000C         91          MVI    12(13),X'FF'    INDICATE CONTROL RETURNED TO
                                92 *                               CALLING PROGRAM
0000DC 07FE                     93          BCR    15,14           RETURN TO CALLING PROGRAM
0000DE 4650 F0EC        000EC   94 SPECIAL  BCT    R5,SP1
                                95 *        TREAT AS NON SPECIAL CASE
0000E2 1A51                     96 SPO      AR     R5,R1
0000E4 5BA0 F1F4        001F4   97          S      R10,S240
0000E8 47F0 F05C        0005C   98          B      AB0
0000EC 1B88                     99 SP1      SR     R8,R8
0000EE 4383 0002        00002   100         IC     R8,2(R3)
0000F2 1A88                     101         AR     R8,R8
0000F4 4A7B B000        00000   102         LH     R7,0(R8,R11)
0000F8 1947                     103         CR     R10,R7
0000FA 4770 F0E2        000E2   104         BNE    SPO
                                105 *       AT LEAST TWO IN A ROW
0000FE 4190 0002        00002   106         LA     R9,2
000102 4450 F1C4        001C4   107 SP2     BCT    R5,SP8
                                108 *       EXACTLY R9 IN A ROW
000106 1B77                     109 SP4     SR     R7,R7
000108 1A51                     110         AR     R5,R1
                                111 *       FIND WHICH SECTION TO USE
00010A 1B88                     112         SR     R8,R8
00010C 90AC F204        00204   113         STM    R10,R12,SAVEREG
000110 1BAA                     114         SR     R10,R10
000112 18B9                     115         LR     R11,R9
000114 43A2 0001        00001   116 SP42    IC     R10,1(R2)
000118 1A7A                     117         AR     R7,R10
00011A 43A4 0001        00001   118         IC     R10,1(R4)
00011E 1A8A                     119         AR     R8,R10
000120 1A21                     120         AR     R2,R1
000122 1A41                     121         AR     R4,R1
000124 46B0 F114        00114   122         BCT    R11,SP42
000128 18B9                     123         LR     R11,R9
00012A 9078 F1FC        001FC   124         STM    R7,R8,UPVAL
00012E 1B77                     125         SR     R7,R7
000130 1B88                     126         SR     R8,R8
000132 43A3 0000        00000   127         IC     R10,0(R3)
000136 43C3 9001        00001   128         IC     R12,1(R3,R9)
00013A 1A7A                     129 SP44    AR     R7,R10
00013C 1A8C                     130         AR     R8,R12
00013E 46B0 F13A        0013A   131         BCT    R11,SP44
000142 58B0 F238        00238   132         L      R11,SPLEFT
000146 1978                     133         CR     R7,R8
000148 4720 F152        00152   134         BH     SP46
00014C 58A0 F23C        0023C   135         L      R11,SPRIGHT
000150 1878                     136         LR     R7,R8
000152 5970 F1FC        001FC   137 SP46    C      R7,UPVAL
000156 4720 F162        00162   138         BH     SP47
00015A 58B0 F234        00234   139         L      R11,SPUPPER
00015E 5870 F1FC        001FC   140         L      R7,UPVAL
000162 5970 F200        00200   141 SP47    C      R7,UPVAL+4
000166 4720 F16E        0016E   142         BH     SP48
00016A 58B0 F240        00240   143         L      R11,SPLOWER
00016E 58A0 F204        00204   144 SP48    L      R10,SAVEREG
000172 58C0 F20C        0020C   145         L      R12,SAVEREG+8
                                146 *       R7 POINTS TO BIT PATTERN
                                147 *       R9 NUMBER OF POINTS TO INSERT
                                148 *       R12 MASK PATTERN TO START
                                149 *       R6 TO OUTPUT AREA
                                150 *       FIX R10
000176 5BA0 F210        00210   151         S      R10,S241
00017A 1AAA                     152         AR     R10,R10
00017C 1AAA                     153         AR     R10,R10
00017E 1B77                     154         SR     R7,R7
000180 1B88                     155         SR     R8,R8
                                156 *       RESET R3 FOR NEXT LINE
000182 1A39                     157         AR     R3,R9
000184 437B A000        00000   158 SP50    IC     R7,0(R11,R10)
000188 43AC F1F7        001F7   159         IC     R8,MASK-1(R12)
00018C 1478                     160         NR     R7,R8
00018E 4386 0000        00000   161         IC     R8,0(R6)
000192 1678                     162         OR     R7,R8
000194 4276 0000        00000   163         STC    R7,0(R6)
000198 437B A001        00001   164         IC     R7,1(R11,R10)
```

TABLE II

```
00019C 43BC F1F7          001F7  165         IC    R8,MASK-1(R12)
0001A0 1478                      166         NR    R7,R8
0001A2 4386 0800          00800  167         IC    R8,2048(R6)
0001A6 1678                      168         OR    R7,R8
0001A8 4276 0800          00800  169         STC   R7,2048(R6)
0001AC 46C0 F186          00186  170         BCT   R12,SP52
0001B0 41C0 0004          00004  171         LA    R12,4
0001B4 1A61                      172         AR    R6,R1
0001B6 1AA1                      173 SP52    AR    R10,R1
0001B8 4690 F184          00184  174         BCT   R9,SP50
                                 175 *       FINISHED WITH SPECIAL_CASE
0001BC 58B0 F208          00208  176         L     R11,SAVEREG+4
0001C0 47F0 F000          000D0  177         B     AB8
0001C4 4383 9001          00001  178 SP8     IC    R8,1(R3,R9)
0001C8 1488                      179         AR    R8,R8
0001CA 4878 B000          00000  180         LH    R7,0(R8,R11)
0001CE 19A7                      181         CR    R10,R7
0001D0 4770 F106          00106  182         BNE   SP4
                                 183 *       SAME ADD TO COUNTER
0001D4 1A91                      184         AR    R9,R1
                                 185 *       CHECK IF COUNTER EQUAL 4
0001D6 5990 F4CC          004CC  186         C     R9,=F'4'
0001DA 4770 F1E6          001E6  187         BNE   SP9
                                 188 *       CHECK IF SPECIAL CODE IS 1
0001DE 5940 F210          00210  189         C     R10,S241
0001E2 4780 F106          00106  190         BE    SP4
                                 191 *       CHECK IF COUNTER EQUAL 6
0001E6 5990 F4D0          004D0  192 SP9     C     R9,=F'6'
0001EA 4780 F106          00106  193         BE    SP4
0001EE 47F0 F102          00102  194         B     SP2
0001F2 0000
0001F4 000000F0                  195 S240    DC    F'240'
0001F8 030C30C0                  196 MASK    DC    X'030C30C0'
0001FC                           197 UPVAL   DS    2F
000204                           198 SAVEREG DS    3F
000210 000000F1                  199 S241    DC    F'241'
000214 00000264                  200 UPPER   DC    A(ODDLINET)
000218 00000314                  201 LEFT    DC    A(ODDLINEL)
00021C 000002AC                  202 RIGHT   DC    A(ODDLINER)
000220 0000036C                  203 LOWER   DC    A(ODDLINEB)
000224 00000290                  204 EVENLINE DC   A(EVLINET)
000228 00000340                  205         DC    A(EVLINEL)
00022C 000002E8                  206         DC    A(EVLINER)
000230 00000398                  207         DC    A(EVLINEB)
000234 000003C4                  208 SPUPPER DC    A(OLT)
000238 00000444                  209 SPLEFT  DC    A(OLL)
00023C 00000404                  210 SPRIGHT DC    A(OLR)
000240 00000484                  211 SPLOWER DC    A(OLB)
000244 000003E4                  212 SPEVLINE DC   A(ELT)
000248 00000464                  213         DC    A(ELL)
00024C 00000424                  214         DC    A(ELR)
000250 000004A4                  215         DC    A(ELB)
000254                           216 SAVEL   DS    4F
000264 0000001100440000           217 ODDLINET DC  X'000000110044000088004400228822888118811966'
000274 AA55AA559966AA55           218         DC   X'AA55AA559966AA55AA55AA55FF66FF66FF77EE77FFFF'
000280 0000000000002200           219 EVLINET DC   X'00000000000022002200001100110011881188116600'
000286 0099AA0066996666           220         DC   X'0099AA0066996666EE99AA55AA55FF66EE77FFDDFFFF'
00028E 0000000000220044           221 ODDLINER DC  X'0000000000220044110055220230228855005522116'
0002A2 5522552211661166           222         DC   X'5522552211661166EE9966AA55006655FFEE77DDFFFFF'
0002AA 0000000000002200           223 EVLINER DC   X'000000000000002200442200006655FFEE77DDFFFFFF'
0002B2 11AA552266990022           224         DC   X'11AA5522699DD02255AAAA558B55FF55FF7777FFFFFF'
0002BE 0000000000000022           225 ODDLINEL DC  X'000000000000000022004440088008800228844880066'
00032A 9900005599666666           226         DC   X'9900005599666666666AA5555BB66FFEE77BBFFFFFF'
000340 0000000022000000           227 EVLINEL DC   X'000000002200000000110C111144114278866986699'
000356 AA55AA556699AA55           228         DC   X'AA55AA556699AA55AA55AA5566FFEEFFEEFFFFFF'
00035C 0000000000000022           229 ODDLINEB DC  X'0000000000000022002240011988AA00114411488866'
000382 5588844A996664486          230         DC   X'5588844A996644B685AAAA55B866AAFFEEFFFFEFFFFF'
000390 0000110044004400           231 EVLINEB DC   X'0000110044004400008800990044114400AADOAA6688'
0003A6 449944AA668877B8           232         DC   X'449944AA6688778B6699AA55DDAAFFAAEE77FFBBFFFF'
0003BC 0000440000000000           233 OLT     DC    X'0011000000000000'
0003C4 0000440000000000           234         DC    X'0000440000000000'
0003CC 4400880000440000           235         DC    X'4400880000440000'
0003D0 110000448B110000           236         DC    X'110000448B110000'
0003E4 0000000000000000           237 ELT     DC    X'0000004488110000'
0003EC 2200000000000000           238         DC    X'2200000022000000'
0003F4 0011001100000000           239         DC    X'001100110000000'
0003FC 8800114800000000           240         DC    X'880011480000000'
000404 0000004400000000           241 OLR     DC    X'0000008800000000'
00040C 0000220000000000           242         DC    X'00002200000000'
000414 4400440000220000           243         DC    X'440044000022000'
00041C 1100002222000000           244         DC    X'110002222000000'
000424 0000000000220000           245 ELR     DC    X'00000000000000'
00042C 2200000022000000           246         DC    X'2200000022000000'
000434 0011001100000000           247         DC    X'0011001100000000'
00043C 8800004888110000           248         DC    X'8800008888110000'
000444 0000000000000000           249 OLL     DC    X'0000000000000000'
00044C 0022000000220000           250         DC    X'0022000000220000'
000454 4400440000000000           251         DC    X'4400440000000000'
00045C 1100000022000000           252         DC    X'1100000022000000'
000464 0000330000000000           253 ELL     DC    X'1100000022000000'
00046C 0000002200000000           254         DC    X'0000004400000000'
000474 0011001122000000           255         DC    X'000000220000000'
00047C 8800224481110000           256         DC    X'001100112200000'
000484 0000000000000000           257 OLB     DC    X'8800228888110000'
00048C 0022000000220000           258         DC    X'0000000000000000'
000494 4400880000000000           259         DC    X'0022000000220000'
00049C 1100004488000000           260         DC    X'4400880000000000'
0004A4 1100000000000000           261 ELB     DC    X'1100004488000000'
0004AC 0000004400000000           262         DC    X'1100000000000000'
0004B4 0011001144000000           263         DC    X'0000004400000000'
0004BC 8800224888110000           264         DC    X'0011001144000000'
0004C0                            265         DC    X'8800228888110000'
000000                            266 CONVTAB DS    256H
000000                            267         END   BIKCON
0004C8 00000000                   268               =A(CONVTAB)
0004CC 00000004                   269               =F'4'
0004D0 00000006                   270               =F'6'
```

What is claimed is:

1. Improved apparatus for converting a series of digital words representative of optical densities within an image at locations corresponding to the positions of said words in said series into a series of bit sets for control of a dot matrix recorder comprising:
   (a) first storage means for storing a string of bit patterns having bits arranged therein in correspondence with dot positions in a set of dot matrix groups, each of which matrix groups is optically representative of a predetermined optical density and comprises a plurality of dot matrices,
   (b) second storage means for storing and reading out of said series of digital words.
   (c) pattern selection means for causing said first storage means to read out bit patterns for matrix groups corresponding in optical density to the optical densities represented by the digital words read out of said second storage means, and
   (d) bit selection means for selecting from said bit patterns sets of bits corresponding to dot matrices positioned within said matrix groups in accordance with the positioning of said digital words within said series.

2. Apparatus according to claim 1 wherein said first storage means comprises means for storing a plurality of strings of bit patterns which correspond to sets of dot matrix groups optically representative of similar gray levels by different dot arrangements, said apparatus further comprising string selection control means for causing said pattern selection means to select the string of bit patterns from which said pattern selection is made.

3. Apparatus according to claim 2 wherein said string selection control means causes string selection on the basis of optical densities at points adjacent to an image point being reproduced.

4. Apparatus according to claim 1 wherein said bit selection means selects sets of four bits corresponding to 2 by 2 dot matrices.

5. Apparatus according to claim 2 wherein said first storage means comprises means for storing a plurality of strings of bit patterns which correspond to sets of dot matrix groups optically representative of similar gray levels by different dot arrangements, said apparatus further comprising string selection control means for causing said pattern selection means to select the string of bit patterns from which said pattern selection is made.

6. Apparatus according to claim 5 wherein said string selection control means causes string selection on the basis of optical densities at points adjacent to an image point being reproduced.

* * * * *